United States Patent
Li et al.

(10) Patent No.: US 9,553,608 B2
(45) Date of Patent: Jan. 24, 2017

(54) DATA STORAGE DEVICE DECODER AND METHOD OF OPERATION

(71) Applicant: SANDISK TECHNOLOGIES INC., Plano, TX (US)

(72) Inventors: Zongwang Li, Dublin, CA (US); Manuel Antonio D'Abreu, El Dorado Hills, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 130 days.

(21) Appl. No.: 14/137,814

(22) Filed: Dec. 20, 2013

(65) Prior Publication Data

US 2015/0178151 A1 Jun. 25, 2015

(51) Int. Cl.
*H03M 13/11* (2006.01)
*G06F 11/10* (2006.01)

(52) U.S. Cl.
CPC ........ *H03M 13/118* (2013.01); *G06F 11/1044* (2013.01); *G06F 11/1068* (2013.01)

(58) Field of Classification Search
CPC .......................... H03M 13/118; G06F 11/1068
See application file for complete search history.

(56) References Cited

U.S. PATENT DOCUMENTS

| | | | |
|---|---|---|---|
| 3,665,396 A | 5/1972 | Forney, Jr. | |
| 4,849,956 A | 7/1989 | Aizawa | |
| 6,003,151 A | 12/1999 | Chuang | |
| 6,088,755 A | 7/2000 | Kobayashi et al. | |
| 6,249,551 B1 | 6/2001 | Yamaguchi | |
| 6,252,917 B1 | 6/2001 | Freeman | |
| 6,522,665 B1 | 2/2003 | Suzuki et al. | |
| 6,662,335 B1 | 12/2003 | Huang | |
| 6,802,033 B1 | 10/2004 | Bertin et al. | |
| 6,842,872 B2* | 1/2005 | Yedida et al. | 714/703 |
| 6,938,196 B2* | 8/2005 | Richardson | G06N 3/02 714/752 |
| 7,055,087 B2 | 5/2006 | Kwon et al. | |
| 7,299,397 B2* | 11/2007 | Yokokawa | H03M 13/11 714/752 |
| 7,359,261 B1 | 4/2008 | Wu et al. | |
| 7,454,685 B2* | 11/2008 | Kim | H03M 13/1114 714/758 |

(Continued)

OTHER PUBLICATIONS

Awais, Muhammad et al. "Flexible LDPC Decoder Architectures," VLSI Design, vol. 2012, Article ID 730835, Hindawi Publishing Corporation, 2012, 16 pages.

(Continued)

*Primary Examiner* — Joseph D Torres
(74) *Attorney, Agent, or Firm* — Toler Law Group, PC (57) ABSTRACT

A data storage device includes a nonvolatile memory and a controller having a decoder. The nonvolatile memory is operatively coupled to the controller. The nonvolatile memory is configured to store a set of bits. The decoder is configured to receive the set of bits from the memory. The decoder is further configured to perform a decoding operation using the set of bits based on a parity check matrix. The parity check matrix includes a block row. The block row has a first non-zero sub-matrix and a second non-zero sub-matrix that is separated from the first non-zero sub-matrix within the block row by at least a threshold number of null sub-matrices of the block row.

20 Claims, 6 Drawing Sheets

(56) References Cited

U.S. PATENT DOCUMENTS

| | | | |
|---|---|---|---|
| 7,770,090 B1* | 8/2010 | Kons et al. | 714/780 |
| 7,937,642 B2* | 5/2011 | Park | H03M 13/1137 714/758 |
| 8,161,345 B2 | 4/2012 | Graef | |
| 8,291,283 B1* | 10/2012 | Rad et al. | 714/752 |
| 8,296,618 B2* | 10/2012 | Senda | 714/752 |
| 8,423,876 B2* | 4/2013 | Okamura et al. | 714/786 |
| 8,456,919 B1 | 6/2013 | Jeon et al. | |
| 8,671,323 B2* | 3/2014 | Sham | H03M 13/1137 714/755 |
| 2002/0083393 A1 | 6/2002 | Hall et al. | |
| 2003/0061558 A1 | 3/2003 | Fackenthal et al. | |
| 2004/0019844 A1 | 1/2004 | Goodnow et al. | |
| 2004/0057575 A1* | 3/2004 | Zhang et al. | 379/399.02 |
| 2004/0261000 A1 | 12/2004 | Hewitt et al. | |
| 2004/0268189 A1 | 12/2004 | Constantinescu | |
| 2005/0268202 A1* | 12/2005 | Molisch et al. | 714/752 |
| 2005/0283709 A1* | 12/2005 | Kyung et al. | 714/758 |
| 2005/0289437 A1* | 12/2005 | Oh et al. | 714/758 |
| 2006/0107187 A1 | 5/2006 | Hannuksela | |
| 2006/0242534 A1* | 10/2006 | Livshitz | 714/758 |
| 2006/0259848 A1 | 11/2006 | Blevins | |
| 2006/0259849 A1 | 11/2006 | Conway | |
| 2007/0038914 A1* | 2/2007 | Bickerstaff et al. | 714/758 |
| 2007/0043998 A1* | 2/2007 | Lakkis | 714/758 |
| 2007/0186137 A1 | 8/2007 | Choi et al. | |
| 2007/0186140 A1* | 8/2007 | Senda | 714/758 |
| 2007/0245217 A1* | 10/2007 | Valle | 714/758 |
| 2007/0260963 A1 | 11/2007 | Chien | |
| 2008/0065971 A1 | 3/2008 | Betts | |
| 2008/0090517 A1 | 4/2008 | Cheng | |
| 2008/0126914 A1 | 5/2008 | Ikeda | |
| 2008/0140686 A1* | 6/2008 | Hong et al. | 707/100 |
| 2008/0250305 A1* | 10/2008 | Lim et al. | 714/801 |
| 2009/0063930 A1* | 3/2009 | Matsumoto et al. | 714/752 |
| 2009/0063931 A1* | 3/2009 | Rovini et al. | 714/758 |
| 2009/0158127 A1 | 6/2009 | Miyauchi et al. | |
| 2009/0276570 A1 | 11/2009 | Cheng et al. | |
| 2009/0292971 A1 | 11/2009 | Man et al. | |
| 2009/0300470 A1 | 12/2009 | Treigherman et al. | |
| 2009/0307537 A1 | 12/2009 | Chen et al. | |
| 2009/0327847 A1* | 12/2009 | Shen et al. | 714/804 |
| 2010/0088573 A1* | 4/2010 | Lakkis | 714/758 |
| 2010/0100790 A1* | 4/2010 | Sutskover | 714/752 |
| 2010/0138719 A1* | 6/2010 | Lee et al. | 714/752 |
| 2010/0251076 A1* | 9/2010 | Wu et al. | 714/773 |
| 2010/0332951 A1 | 12/2010 | Peng et al. | |
| 2011/0010602 A1* | 1/2011 | Chung et al. | 714/752 |
| 2011/0066916 A1* | 3/2011 | Abu-Surra et al. | 714/752 |
| 2011/0179337 A1* | 7/2011 | Chen et al. | 714/763 |
| 2011/0252286 A1 | 10/2011 | Li et al. | |
| 2012/0068251 A1 | 3/2012 | Higuchi et al. | |
| 2012/0089888 A1* | 4/2012 | Li et al. | 714/752 |
| 2012/0198314 A1 | 8/2012 | Yang et al. | |
| 2013/0205182 A1 | 8/2013 | Adas et al. | |
| 2014/0095958 A1 | 4/2014 | Kwok | |
| 2014/0168811 A1 | 6/2014 | Yang et al. | |
| 2014/0223254 A1* | 8/2014 | Pisek | 714/755 |

OTHER PUBLICATIONS

Cui, Z. et al. "Reduced-Complexity Column-Layered Decoding and Implementation for LDPC Codes," IET Communications, The Institution of Engineering and Technology, vol. 5, Issue 15, 2011, pp. 2177-2186.

Gallager, Robert G. "Low-Density Parity-Check Codes," IRE Transaction on Information Theory, Jul. 1963, pp. 1-90.

Lin, Jun et al. "An Improved Min-Sum Based Column-Layered Decoding Algorithm for LDPC Codes," IEEE Workshop on Signal Processing Systems, Oct. 7-9, 2009, pp. 238-242.

Pyndiah, Ramesh Mahendra. "Near-Optimum Decoding of Product Codes: Block Turbo Codes," IEEE Transactions on Communications, vol. 46, No. 8, Aug. 1998, pp. 1003-1010.

Wang, Yige et al. "Construction of High-Girth QC-LDPC Codes," Mitsubishi Electric Research Laboratories, Inc., 5th International Symposium on Turbo Codes and Related Topics, Sep. 2008, 8 pages.

Blake, I.F. "Error Control Coding (S. Lin and D.J. Costello; 2004)," Abstract of Book Review, published in IEEE Transactions on Information Theory, vol. 51, Issue 4, Apr. 2005, http://ieeexplore.ieee.org/xpl/articleDetails.jsp? arnumber=1412058, 1 page.

Planjery, S.K. et al. "Iterative Decoding Beyond Belief Propagation," IEEE Information Theory and Applications Workshop, Jan. 31-Feb. 5, 2010, San Diego, CA, 10 pages.

Declercq, D. et al. "Finite Alphabet Iterative Decoders Approaching Maximum Likelihood Performance on the Binary Symmetric Channel," IEEE Information Theory and Applications Workshop, Feb. 5-10, 2012, San Diego, CA, 10 pages.

Li, Zongwang et al. "Decoding Techniques for a Data Storage Device," U.S. Appl. No. 14/107,973, filed Dec. 16, 2013, 32 pages.

Li, Zongwang et al. "Decoding Techniques for Low-Density Parity Check Codes," U.S. Appl. No. 14/321,069, filed Jul. 1, 2014, 47 pages.

Non-Final Office Action mailed Sep. 29, 2015 in U.S. Appl. No. 14/107,973, 14 pages.

Non-Final Office Action mailed Oct. 23, 2015 in U.S. Appl. No. 14/321,069, 24 pages.

\* cited by examiner

$\alpha_{ij}$ - "Absolute" shift value of $(i,j)$ non-zero sub-matrix $\delta_{ij}$ - Delta-shift value of $(i,j)$ non-zero sub-matrix in block row $i$ relative to previous non-zero sub-matrix in block row $i$ $$300 \rightarrow$$

$$\mathbf{H} = \begin{bmatrix} \alpha_{11} & 0 & 0 & 0 & \alpha_{15} & 0 & 0 & 0 & \cdots & \alpha_{1G} \\ 0 & \alpha_{12} & \alpha_{13} & \alpha_{14} & 0 & \alpha_{16} & \alpha_{17} & \alpha_{18} & \cdots & 0 \\ 0 & \alpha_{21} & 0 & 0 & 0 & 0 & 0 & 0 & \cdots & 0 \\ 0 & 0 & \alpha_{23} & \alpha_{24} & \alpha_{25} & \alpha_{26} & \alpha_{27} & \alpha_{28} & \cdots & \alpha_{2G} \end{bmatrix}$$

$$350 \rightarrow$$

$$\mathbf{H} = \begin{bmatrix} \delta_{11}=\alpha_{11} & 0 & 0 & 0 & \delta_{15}=(\alpha_{15}-\alpha_{11})\%P & 0 & 0 & 0 & \cdots & \delta_{1G} \\ 0 & \delta_{12}=\alpha_{12} & \delta_{13}=\alpha_{13} & \delta_{14}=\alpha_{14} & 0 & \delta_{16}=(\alpha_{16}-\alpha_{21})\%P & \delta_{17}=(\alpha_{17}-\alpha_{12})\%P & \delta_{18}=(\alpha_{18}-\alpha_{13})\%P & \cdots & 0 \\ 0 & \delta_{21}=\alpha_{21} & 0 & 0 & 0 & 0 & 0 & 0 & \cdots & 0 \\ 0 & 0 & \delta_{23}=\alpha_{23} & \delta_{24}=\alpha_{24} & \delta_{25}=\alpha_{25} & \delta_{26}=\alpha_{26} & \alpha_{27} & \delta_{28}=(\alpha_{28}-\alpha_{22})\%P & \cdots & \delta_{2G} \end{bmatrix}$$

$$400 \rightarrow H = \begin{bmatrix} h_{11} & 0 & 0 & 0 & h_{15} & 0 & 0 & 0 & \cdots & h_{1G} \\ 0 & h_{12} & 0 & 0 & 0 & 0 & h_{17} & 0 & \cdots & 0 \\ 0 & 0 & 0 & h_{14} & 0 & 0 & 0 & 0 & \cdots & 0 \\ h_{21} & 0 & 0 & 0 & 0 & h_{16} & 0 & 0 & \cdots & 0 \\ 0 & 0 & h_{13} & 0 & 0 & 0 & 0 & h_{18} & \cdots & 0 \\ 0 & 0 & 0 & 0 & h_{25} & 0 & 0 & 0 & \cdots & 0 \\ 0 & 0 & 0 & 0 & 0 & h_{26} & 0 & 0 & \cdots & 0 \\ 0 & 0 & 0 & h_{24} & 0 & 0 & 0 & 0 & \cdots & 0 \\ 0 & 0 & h_{23} & 0 & 0 & 0 & h_{27} & 0 & \cdots & 0 \\ 0 & h_{22} & 0 & 0 & 0 & 0 & 0 & h_{28} & \cdots & h_{2G} \end{bmatrix}$$

$$410 \rightarrow I_7 = \begin{bmatrix} 1 & 0 & 0 & 0 & 0 & 0 & 0 \\ 0 & 1 & 0 & 0 & 0 & 0 & 0 \\ 0 & 0 & 1 & 0 & 0 & 0 & 0 \\ 0 & 0 & 0 & 1 & 0 & 0 & 0 \\ 0 & 0 & 0 & 0 & 1 & 0 & 0 \\ 0 & 0 & 0 & 0 & 0 & 1 & 0 \\ 0 & 0 & 0 & 0 & 0 & 0 & 1 \end{bmatrix} \qquad 420 \rightarrow P_7^1 = \begin{bmatrix} 0 & 1 & 0 & 0 & 0 & 0 & 0 \\ 0 & 0 & 1 & 0 & 0 & 0 & 0 \\ 0 & 0 & 0 & 1 & 0 & 0 & 0 \\ 0 & 0 & 0 & 0 & 1 & 0 & 0 \\ 0 & 0 & 0 & 0 & 0 & 1 & 0 \\ 0 & 0 & 0 & 0 & 0 & 0 & 1 \\ 1 & 0 & 0 & 0 & 0 & 0 & 0 \end{bmatrix}$$

$$430 \rightarrow P_7^2 = \left(P_7^1\right)^2 = \begin{bmatrix} 0 & 0 & 1 & 0 & 0 & 0 & 0 \\ 0 & 0 & 0 & 1 & 0 & 0 & 0 \\ 0 & 0 & 0 & 0 & 1 & 0 & 0 \\ 0 & 0 & 0 & 0 & 0 & 1 & 0 \\ 0 & 0 & 0 & 0 & 0 & 0 & 1 \\ 1 & 0 & 0 & 0 & 0 & 0 & 0 \\ 0 & 1 & 0 & 0 & 0 & 0 & 0 \end{bmatrix} \qquad 440 \rightarrow P_7^7 = \left(P_7^1\right)^7 = I_7$$

$450 \rightarrow H_1 = \begin{bmatrix} P_7^6 & \cdots & P_7^2 & \cdots & I & \cdots & P_7^1 & \cdots & P_7^5 \end{bmatrix}$ $460 \rightarrow H_1^{-1} = \begin{bmatrix} P_7^1 & \cdots & P_7^5 & \cdots & I & \cdots & P_7^6 & \cdots & P_7^2 \end{bmatrix}$ $470 \rightarrow \tilde{H}_1 = \begin{bmatrix} P_7^1 & \cdots & P_7^4 & \cdots & P_7^2 & \cdots & P_7^3 & \cdots & I \end{bmatrix}$ $480 \rightarrow \tilde{H}_1^\delta = \begin{bmatrix} P_7^1 & \cdots & P_7^3 & \cdots & P_7^5 & \cdots & P_7^1 & \cdots & P_7^4 \end{bmatrix}$

DATA STORAGE DEVICE DECODER AND METHOD OF OPERATION

FIELD OF THE DISCLOSURE

The present disclosure is generally related to decoding techniques for a data storage device.

BACKGROUND

Nonvolatile data storage devices, such as embedded memory devices and removable memory devices, enable portability of data and software applications. In certain flash memory devices, multi-level cell (MLC) storage elements may each store a threshold voltage representing multiple bits of data, enhancing data storage density as compared to single-level cell (SLC) flash memory devices. The enhanced storage density may be associated with increased data errors, such as bit corruption.

To correct data errors, a flash memory device may utilize an error correcting code (ECC) technique. For example, the flash memory device may encode user data using an ECC technique to generate encoded data, such as an ECC codeword. The encoded data may be stored at the flash memory device and may be decoded by a decoder of the flash memory device, such as in response to a request for read access to the data from a host device that accesses the flash memory device.

The flash memory device may use a low-density parity check (LDPC) decoding technique to decode the data. The LDPC decoding technique may use a parity check matrix to decode an ECC codeword, such as by multiplying the parity check matrix and the ECC codeword to generate "decoded" data. Because the ECC codeword includes parity bits that satisfy a set of parity equations specified by the parity check matrix, one or more bit errors in the ECC codeword can be corrected using the LDPC decoding technique.

An LDPC decoding operation may be performed (or represented) using variable nodes and check nodes. The variable nodes may represent bit values of the ECC codeword, and the check nodes may represent the parity equations of the parity check matrix. Each variable node may be connected to one or more of the check nodes. The connections (or "constraints") may represent the set of parity equations specified by the parity check matrix. If bit values of the decoded data satisfy the set of parity equations, then the decoded data is "correct" (e.g., has been successfully decoded).

If one or more bit values of the decoded data do not satisfy the set of parity equations, then one or more bit errors may be present in the ECC codeword. To illustrate, if a threshold voltage representing a particular bit of the ECC codeword is unreliable (e.g., has a value that is at or near a border between a state indicating a "0" value and a state indicating a "1" value), the correct value of the bit may be determined by verifying whether assigning a "0" value or a "1" value for the bit satisfies the set of parity equations.

If the ECC codeword includes multiple unreliable bits, decoding the ECC codeword may include "checking" each of the unreliable bits to see if a value can be determined for each unreliable bit. As an example, if a first check node is connected to multiple variable nodes associated with unreliable bits, then the parity equations corresponding to the first check node may be underdetermined. To decode the ECC codeword, a second check node may be identified connecting to a variable node associated with one of the unreliable bits. The parity equations corresponding to the second check node may be used to assign a value to the unreliable bit. After determining the value for the unreliable bit, the first check node may re-checked to determine whether the parity check equations corresponding to the first check node are no longer underdetermined or whether another check node should be identified connecting to a variable node associated with another one of the unreliable bits. Decoding the ECC codeword may include multiple such iterations to generate error-corrected data. Further, although the foregoing example uses binary values ("0" values and "1" values) for purposes of illustration, other types of values may be used in LDPC decoding. For example, a check node may pass to a variable node a log-likelihood ratio (LLR) (instead of a "0" value or a "1" value). An LLR may indicate a likelihood that a particular bit has a "0" value or a "1" value. In a two-phase message passing (TPMP) (or "belief propagation") LDPC decoding scheme, messages may be passed between variable nodes and check nodes indicating bit reliability based on currently available information (e.g., based on information determined during a previous iteration of the decoding operation). Because of the complexity of LDPC computations, numerous techniques for decoding LDPC-encoded ECC codewords have been developed.

SUMMARY

A data storage device in accordance with the present disclosure may increase efficiency and processing speed of a low density parity check (LDPC) decoding operation by using a parity check matrix having entries determined based on one or more criteria. The criteria may specify that each row of sub-matrices (or a "block row") of the parity check matrix is to include non-zero sub-matrices separated by at least a threshold number of null sub-matrices. By separating non-zero sub-matrices of the block row using at least the threshold number of null sub-matrices, decoder hardware of the data storage device can be "pipelined" to improve performance of the decoder.

The one or more criteria may specify that the parity check matrix has "pre-shifted" values. For example, values of the parity check matrix may be arranged such that variable node unit (VNUs) of the decoder directly receive results generated by check node units (CNUs) of the decoder. Because the values are "pre-shifted," the results may be provided to the VNUs without providing the results to a barrel shifter for shifting prior to providing the results to the VNUs.

A decoding scheme in accordance with the present disclosure may improve performance, such as by reducing pipeline conflicts associated with randomly or pseudo-randomly generated parity check matrices. To illustrate, during design of a typical LDPC decoder, hardware of the decoder may be designed to operate in connection with a randomly generated parity check matrix, or the hardware may be designed without information related to the parity check matrix (e.g., by modeling the parity check matrix as being randomly generated). By constructing a parity check matrix in accordance with the present disclosure, hardware design of an LDPC decoder can be simplified using information related to properties of the parity check matrix. In addition, one or more properties of the parity check matrix may be selected to improve decoding performance of the LDPC decoder, as described further with reference to the Drawings and Detailed Description.

DETAILED DESCRIPTION

Low-density parity check (LDPC) decoding techniques include "flooding" decoding schemes and "layered" decoding schemes. A flooding decoding scheme may iteratively process each variable node corresponding to a parity check matrix prior to processing check nodes corresponding to the parity check matrix, and vice versa. However, waiting for all check nodes to be updated prior to updating variable nodes may be inefficient.

In a layered decoding scheme, a variable node may be updated as soon as updated check node information is available. Layered decoding schemes include "row-layered" and "column-layered" decoding schemes. A row-layered decoding scheme may divide rows of a parity check matrix into layers. During a particular clock cycle, the row-layered decoding scheme may process each variable node associated with a current layer based on check node results of a previous layer and may process a check node associated with the layer based on check node and variable node results of the previous layer. The row-layered decoding scheme typically has high performance (e.g., fast decoder convergence), but may also use high memory bandwidth to support exchange of information between layers.

A column-layered decoding scheme may update check nodes associated with a row and variable nodes associated with a row based on current information associated with the row. For example, a column-layered decoding scheme may update variable nodes associated with a portion (e.g., a "column layer") of a row a parity check matrix based on check node results associated with a remainder of the row and vice versa. Because rows may be processed independently, a column-layered decoding scheme may utilize lower memory bandwidth compared to a row-layered decoding scheme, which has resulted in academic research and other interest in column-layered techniques. However, a column-layered decoding scheme may be associated with large circuitry overhead and computational complexity to perform check node computations for each row of the parity check matrix. Consequently, many conventional LDPC decoders utilize a row-layered decoding scheme instead of a column-layered decoding scheme to avoid or reduce computational complexity associated with concurrent processing of multiple check nodes.

A data storage device in accordance with the present disclosure may operate according to a decoding scheme that uses a parity-check matrix having entries selected based on one or more criteria. The one or more criteria may enable column-layered LDPC decoding operations that perform variable node updates and check node updates concurrently based on results from a previous layer, which may improve performance of the decoder. In a particular embodiment, the parity check matrix is arranged to enable a column-layered decoding scheme that processes a column layer of check nodes and variable nodes based on results of processing a previous column layer of check nodes and variable nodes. The column-layered decoding scheme may process variable nodes and check nodes concurrently instead of separately, increasing decoding throughput. The decoding scheme may facilitate the low memory bandwidth associated with a flooding decoder scheduler while also enabling fast performance similar to a row-layered decoder scheduler.

Figure 1:
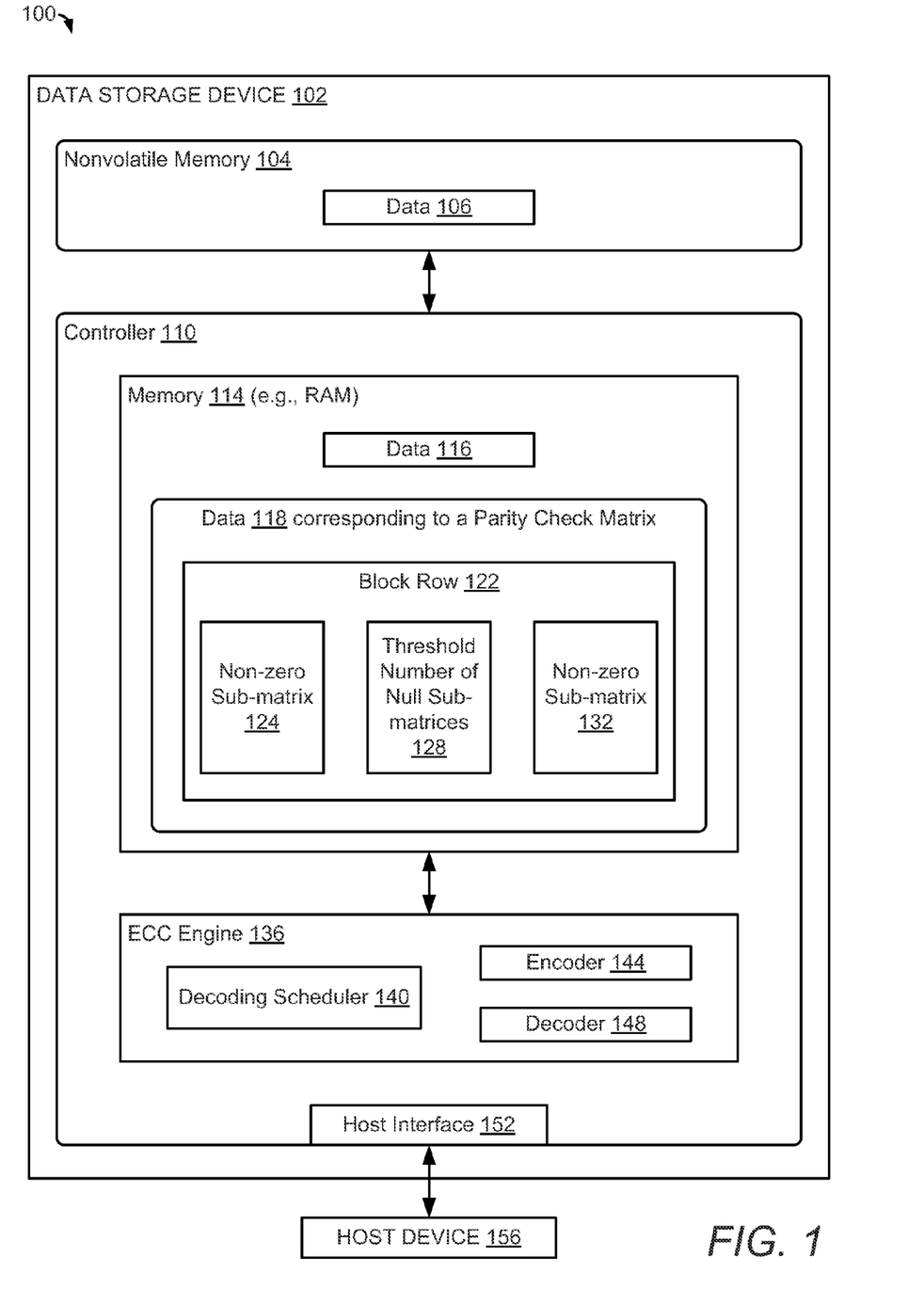
FIG. 1 is a diagram of a particular illustrative embodiment of a system that includes a data storage device.

Referring to FIG. 1, a particular illustrative embodiment of a system is depicted and generally designated 100. The system 100 includes a data storage device 102 and a host device 156. The data storage device 102 may be embedded within the host device 156, such as in accordance with a Joint Electron Devices Engineering Council (JEDEC) Solid State Technology Association Universal Flash Storage (UFS) configuration. Alternatively, the data storage device 102 may be removable from the host device 156 (i.e., "removably" coupled to the host device 156). As an example, the data storage device 102 may be removably coupled to the host device 156 in accordance with a removable universal serial bus (USB) configuration.

The data storage device 102 may include a memory, such as a nonvolatile memory 104, and a controller 110. The controller 110 is coupled to the nonvolatile memory 104. The nonvolatile memory 104 may store data, such as data 106. The controller 110 may include a memory 114, an error correcting code (ECC) engine 136, and a host interface 152. The memory 114 may include random access memory (RAM). Alternatively or in addition, the memory 114 may include another type of memory, such as a nonvolatile memory.

The memory 114 may store data and/or instructions usable by the controller 110. For example, the memory 114 may store data 116 and data 118. The data 116 may correspond to data that is sensed from the nonvolatile memory 104. For example, the controller 110 may generate the data 116 by sensing the data 106. The data 116 may include a set of bits, such as a set of "soft" bits, a set of "hard" bits, or a combination thereof.

The data 118 may correspond to a parity check matrix usable by the decoder 148. For example, the data 118 may correspond to a low-density parity check (LDPC) matrix useable by the ECC engine 136. The data 118 may include a block row 122. As used herein, a "block row" may indicate a row of sub-matrices. An example of a block row is a row of circulant matrices (e.g., a row of matrices that correspond to row-shifted versions of the identity matrix). The block row 122 may include a non-zero sub-matrix 124 (e.g., an identity matrix or a row-shifted identity matrix), a threshold number of null sub-matrices 128 (e.g., a particular number of zero matrices), and a non-zero sub-matrix 132 (e.g., an identity matrix or a row-shifted identity matrix). The ECC engine 136 may include a decoding scheduler 140, an encoder 144, and a decoder 148. In a particular embodiment, the decoding scheduler 140 is configured to schedule decoding operations at the decoder 148 according to a column-layered LDPC decoding technique.

The controller 110 is configured to receive data and instructions from the host device 156 and to send data to the host device 156. For example, the controller 110 may send data to the host device 156 via the host interface 152 and may receive data from the host device 156 via the host interface 152.

The ECC engine 136 is configured to receive data and to generate one or more error correcting code (ECC) codewords based on the data. For example, the encoder 144 may be configured to encode data using an ECC encoding technique, such as an LDPC encoding technique. The encoder 144 may include a Hamming encoder, a Reed-Solomon (RS) encoder, a Bose-Chaudhuri-Hocquenghem (BCH) encoder, an LDPC encoder, a turbo encoder, an encoder configured to encode data according to one or more other ECC techniques, or a combination thereof.

The controller 110 is configured to send data and commands to the nonvolatile memory 104 and to receive data from the nonvolatile memory 104. For example, the controller 110 is configured to send the data 106 and a write command to cause the nonvolatile memory 104 to store the data 106 to a specified address of the nonvolatile memory 104. The write command may specify a physical address of a portion of the nonvolatile memory 104 (e.g., a physical address of a word line of the nonvolatile memory 104) that is to store the data 106. The data 106 may correspond to one or more ECC codewords generated by the encoder 144. The controller 110 may access the data 106 using one or both of a "hard" read technique to generate a set of hard bits representing the data 106 (e.g., "0" bits and "1" bits) and a "soft" read technique to generate reliability information representing the data 106 (e.g., a set of soft bits having a greater range of values than the set of hard bits).

The controller 110 is configured to send a read command to the nonvolatile memory 104 to access data from a specified address of the nonvolatile memory 104. As an example, the controller 110 may send a read command to access the data 106. The read command may specify the physical address of a portion of the nonvolatile memory 104 (e.g., a physical address of the word line storing the data 106).

The ECC engine 136 is configured to decode data accessed from the nonvolatile memory 104. To illustrate, the data 106 may be (or may include) one or more ECC codewords that can be decoded by the decoder 148. The decoder 148 may be configured to decode data read from the nonvolatile memory 104 to detect and correct one or more bit errors that may be present in the read data, up to an error correcting capacity of the ECC encoding scheme used to encode the data 106. Bit errors may occur in the data 106 while writing the data 106 (e.g., due to over-programming or under-programming storage elements of the nonvolatile memory 104), during storage of the data 106 (e.g., due to charge leakage), and/or while accessing the data 106 (e.g., due to noise or other factors).

In operation, the ECC engine 136 may use the data 118 in one or more decoding operations to decode data, such as the data 106. The ECC engine 136 may perform a decoding operation according to scheduling by the decoding scheduler 140. To illustrate, if the data 106 includes LDPC-encoded data, the decoder 148 may decode the data 106 "iteratively." To iteratively decode the data 106, the decoder 148 may pass messages between variable node units (VNUs) and check node units (CNUs) of the decoder 148. Examples of VNUs and CNUs are described further with reference to FIG. 5.

The messages may indicate reliability of bit values of the data 106, such as log-likelihood ratios (LLRs) associated with bit values of the data 116. The decoder 148 may decode the data 106 by iteratively updating the LLRs and passing the LLRs between the VNUs and the CNUs until the decoding operation "converges" on a particular set of bit values corresponding to the data 106 (or until the decoding operation times out, such as in response to iterating the decoding operation a threshold number of times).

In FIG. 1, the non-zero sub-matrices 124, 132 are separated by the null sub-matrices 128. At least a threshold number of null sub-matrices separate the non-zero sub-matrices 124, 132. To illustrate, in a particular example, the threshold number is three, and at least three null sub-matrices separate consecutive non-zero sub-matrices in each block row of the parity check matrix represented by the data 118. In this example, the null sub-matrices 128 include at least three null sub-matrices that separate the non-zero sub-matrices 124, 132. It should be appreciated that the foregoing example is illustrative and that the threshold number of null sub-matrices may be selected based on the particular application.

Figure 2:
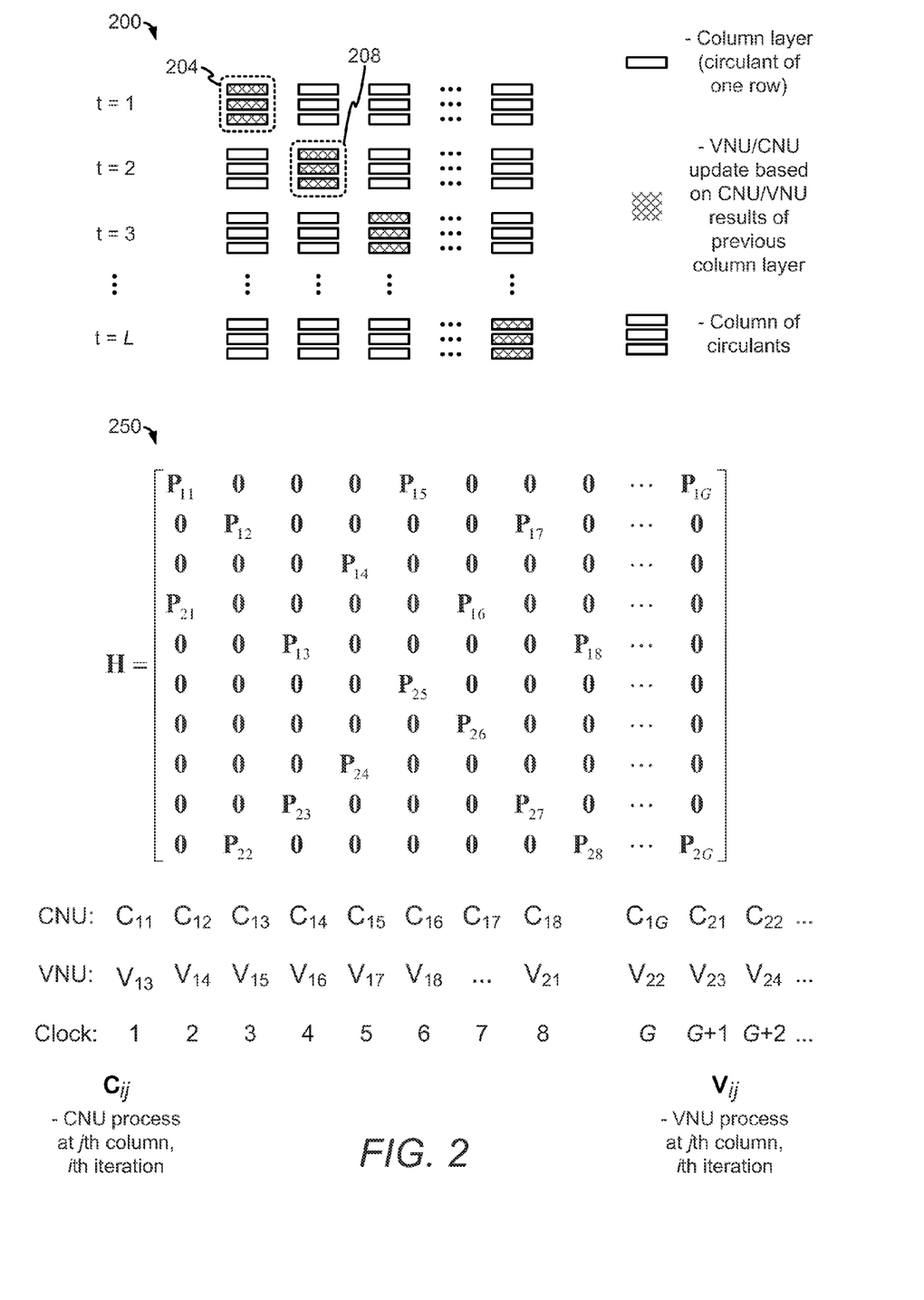
FIG. 2 illustrates an example timing sequence of the column-layered decoding scheduler FIG. 1 and an example of a parity check matrix that can be used by the data storage device of FIG. 1.

As described further with reference to FIG. 2, including at least a threshold number of null sub-matrices between non-zero sub-matrices in each block row of the parity check matrix indicated by the data 118 may simplify decoding operations at the decoder 148. For example, instead of scheduling check node updates and variable node updates separately for a column layer based on current results of the column layer, the techniques of FIG. 1 may enable concurrent updating of variable nodes and check nodes for a column layer based on a results of a previous column layer, as described further with reference to FIG. 2.

FIG. 2 illustrates an illustrative embodiment of a timing sequence 200 of the decoding scheduler 140 and an illustrative embodiment of a parity check matrix 250 used by the data storage device of FIG. 1. The parity check matrix 250 may correspond to the data 118 of FIG. 1.

The timing sequence 200 illustrates that the decoding scheduler 140 may schedule concurrent processing of variable node units (VNUs) and check node units (CNUs) for a column layer based on a results of processing VNUs and CNUs for a previous column layer. To illustrate, the decoding scheduler 140 may process VNUs and CNUs for column layers 208 during a clock cycle t=2 based on results of processing VNUs and CNUs for column layers 204 generated during a clock cycle t=1.

Each entry of the parity check matrix 250 represents either a non-zero sub-matrix (e.g., a non-zero circulant matrix having m rows and m columns, such as an identity matrix or cyclic permutation of an identity matrix, where m is a positive integer number greater than one) or a null sub-matrix (e.g., a matrix of m rows of zero values and m columns of zero values). Each row of the parity check matrix 250 represents a block row (e.g., a row of sub-matrices). That is, each row depicted in the parity check matrix 250 can be mapped to a plurality of rows by expanding each sub-matrix in the row.

The parity check matrix 250 (H) illustrates that each non-zero sub-matrix (or non-zero circulant, P) within a block row is separated from another non-zero sub-matrix within the block row by at least three null sub-matrices (or zero-valued sub-matrices, 0). To illustrate, the first block row of the parity check matrix 250 includes a non-zero sub-matrix P11, a non-zero sub-matrix P15, and a non-zero sub-matrix P1G, where G is a positive integer that indicates a number of clock cycles to traverse a block row of the parity check matrix 250. The example of FIG. 2 illustrates that each of the non-zero sub-matrices P11, P15, and P1G are separated by at least three null sub-matrices 0 within the first block row. In the second block row of the parity check matrix 250, a non-zero sub-matrix P12 is separated from a non-zero sub-matrix P17 by four null sub-matrices 0.

FIG. 2 depicts an illustrative sequence of check node update (CNU) operations and variable node update (VNU) operations that may be performed by the decoder 148 during an LDPC decoding operation. The CNU and VNU operations are performed during clock cycles of a clock signal (e.g., a pipeline clock signal) provided to the decoder 148. To illustrate, the example of FIG. 2 depicts that during a first clock cycle (clock "1"), the decoder 148 performs a first CNU operation (C11) and a first VNU operation (V13). The first CNU operation C11 corresponds to a first iteration of processing the first column layer that includes the sub-matrix P11 and the sub-matrix P21. During the first CNU operation C11, an LDPC check node update may be performed at the decoder 148. The first VNU operation V13 corresponds to a first iteration of processing the third column layer that includes the sub-matrix P13 and the sub-matrix P22. During the first VNU operation V13, an LDPC variable node update may be performed at the decoder 148.

In FIG. 2, operations using a non-zero sub-matrix of the parity check matrix 250 within a block row may depend on results of operations that use a previous non-zero sub-matrix of the parity check matrix 250 within the block row. To illustrate, operations using the non-zero sub-matrix P15 may utilize results of operations that use the non-zero sub-matrix P11. Because a threshold number of null sub-matrices separate the non-zero sub-matrix P11 and the non-zero sub-matrix P15, at least the threshold number of clock cycles separate processing of the sub-matrices P11, P15, so that results of operations that use the non-zero sub-matrix P11 are available when operations using the non-zero sub-matrix P15 are initiated. Consequently, by using the parity check matrix 250, the decoder 148 may avoid "stalling" operations that depend on results of previous operations to wait for the results to become available. In a particular embodiment, LDPC decoding operations can be pipelined based on the arrangement of the parity check matrix 250.

Further, in the example of FIG. 2, columns of the parity check matrix 250 are arranged to avoid (or reduce) out-of-order processing and to avoid or reduce pipeline conflict issues. To achieve bigger pipeline levels and improve a critical path of the decoder 148, entries of the parity check matrix 250 can be selected based on an "overlap schedule" to enable pipelined decoding at the decoder 148. For example, if the number of null sub-matrices between two non-zero sub-matrices is less than a number of pipeline stages of a decoder, the decoder may wait one or more idle cycles during a decoding operation. By selecting entries of the parity check matrix 250 based on the overlap schedule, the decoder 148 may perform decoding operations without idle cycles.

Figure 3:
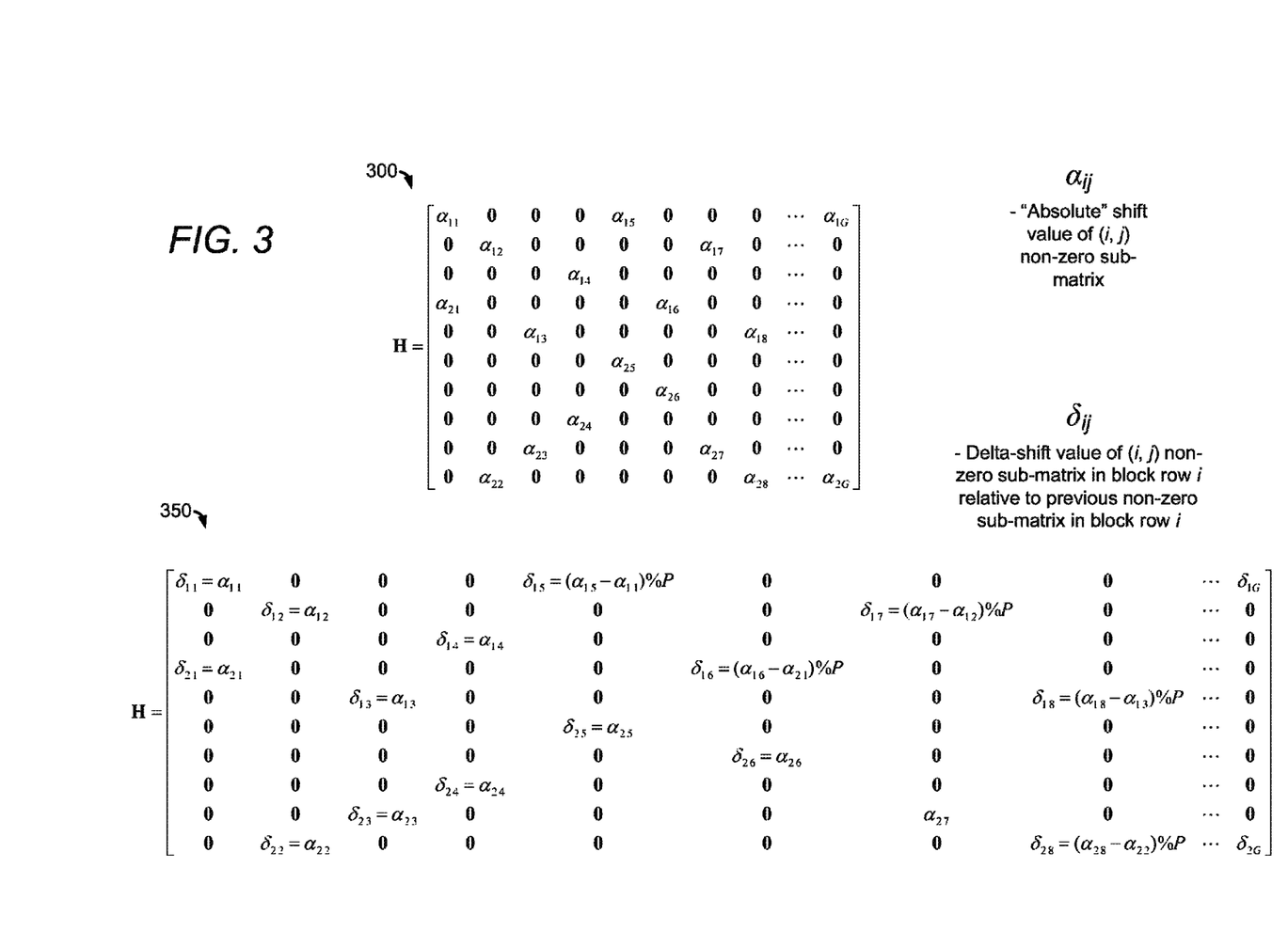
FIG. 3 is a diagram illustrating example shift values corresponding to the parity check matrix of FIG. 2.

FIG. 3 illustrates additional details of the parity check matrix 250. For example, FIG. 3 depicts a parity check matrix 300 having "absolute" shift values (α) that correspond to the non-zero sub-matrices (P) of the parity check matrix 250. FIG. 3 further depicts a parity check matrix 350 having delta-shifted values (δ) that correspond to the non-zero sub-matrices (P) of the parity check matrix 250. In the parity check matrix 350, the absolute shift values δ of non-zero sub-matrices in a block row have been delta-shifted relative to previous non-zero sub-matrices in the block row. As an example, the parity check matrix 350 illustrates that the non-zero sub-matrix P15 has been delta-shifted relative to the non-zero sub-matrix P11 according to δ15=(α15−α11)% P, where P indicates a size of each non-zero sub-matrix and % indicates the modulo operator. In the parity check matrix 350, entries are "pre-shifted" to simplify operation of the decoder 148, as described further with reference to FIG. 4.

Figure 4:
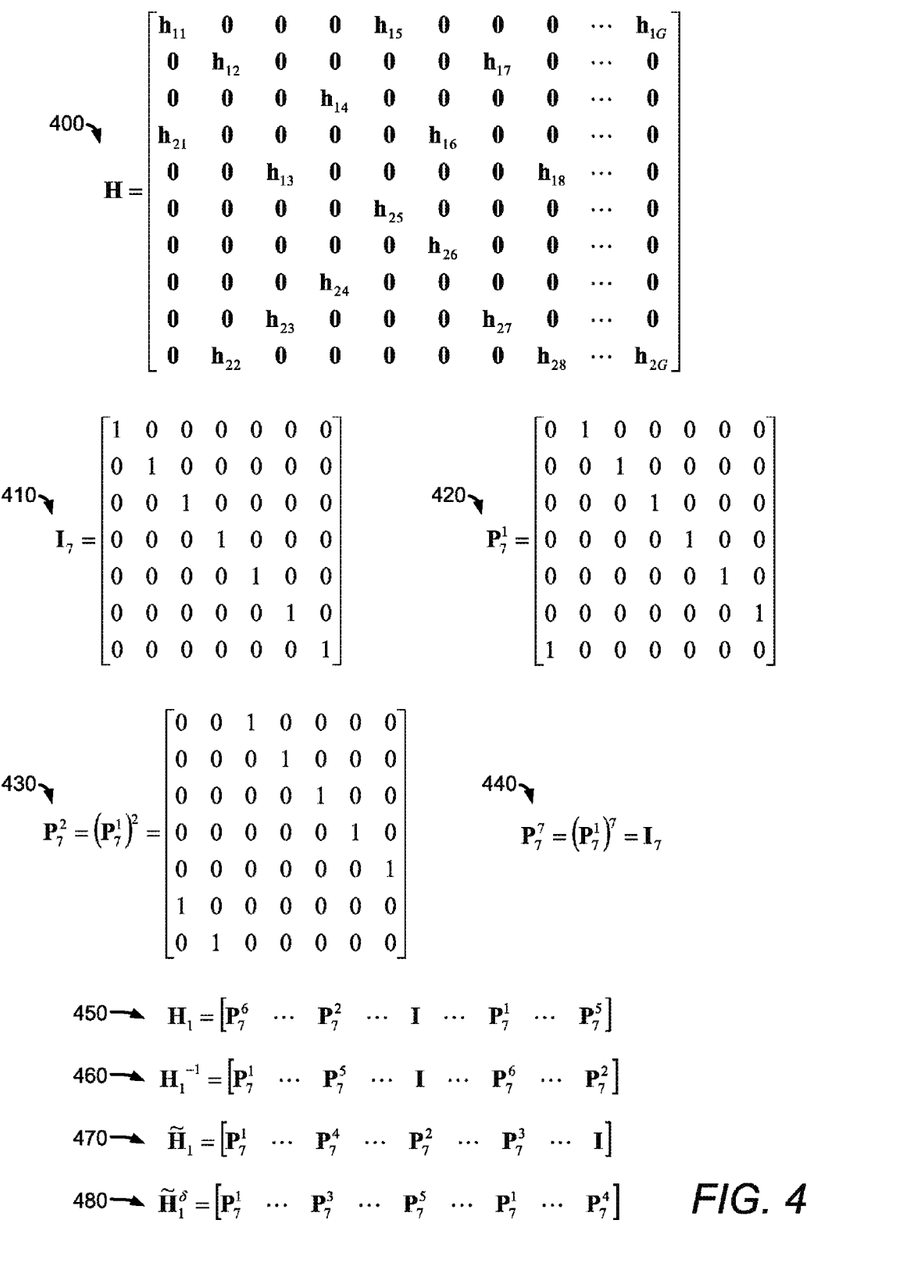
FIG. 4 is a diagram illustrating additional aspects of a particular embodiment of the parity check matrix of FIG. 2.

FIG. 4 illustrates additional aspects of a particular embodiment of the parity check matrix 250. FIG. 4 illustrates a parity check matrix 400 having non-zero circulant sub-matrix entries (h) that correspond to the non-zero sub-matrices (P) of the parity check matrix 250. In FIG. 4, each non-zero circulant sub-matrix entry h is either an identity matrix having seven rows and seven columns or a shifted version of the identity matrix (e.g., a cyclic permutation of the identity matrix).

To further illustrate, FIG. 4 depicts an identity matrix 410 having seven rows and seven columns. The identity matrix 410 can be shifted to generate a circulant matrix 420. The circulant matrix 420 is column-shifted once relative to the identity matrix 410. The identity matrix 410 can be shifted to generate a circulant matrix 430. The circulant matrix 430 is column-shifted twice relative to the identity matrix 410 and once relative to the circulant matrix 420. The identity matrix 410 may be column-shifted seven times to generate a circulant matrix 440 that is identical to the identity matrix 410 (based on a modulus of seven in this example). Each non-zero circulant sub-matrix entry h in the parity check matrix 400 may correspond to the identity matrix 410, one of the circulant matrices 420, 430, and 440, or another circulant matrix.

FIG. 4 further depicts an example of a block row 450. The block row 450 includes circulant matrices (P) and an identity matrix (I). If the block row 450 is "absolutely" shifted, then an inverted block row 460 may be generated. For example, each non-zero entry of the block row 450 may be inverted to generate the inverted block row 460.

FIG. 4 further depicts a block row 470. The block row 470 may be generated based on row permutations of the block row 450 (i.e., the block row 470 may be generated by row-permuting each sub-row of the block row 450). For certain LDPC processing operations, the block row 470 is "equivalent" (or similar) to the block row 450 and can be used instead of the block row 450.

A delta-shifter block row 480 corresponds to the block row 470. In the delta-shifter block row 480, a non-zero entry may be correspond to a shift amount by which the previous non-zero entry in the delta-shifter block row 480 is to be shifted to generate the corresponding entry in the block row 470. For example, to generate the second entry in the block row 470, the first entry in the block row 470 may be delta-shifted by a shift amount indicated by the second entry in the delta-shifter block row 480. As another example, to generate the third entry in the block row 470, the second entry in the block row 470 may be delta shifted by the third entry in the delta-shifter block row 480 (modulus seven).

FIG. 4 therefore describes a block row having entries that can be delta shifted based on previous entries in the block row. Such a technique may conserve hardware and processing resources at the decoder 148. To further illustrate, certain conventional devices utilize a decoder that shifts each entry of a block row based on an identity matrix. Such a device may independently generate each entry of a block row based on the identity matrix. FIG. 4 illustrates that entries of a block row can be delta-shifted relative to previous entries in the block row. For example, each entry of the block row 470 can be generated by delta-shifting a previous entry in the block row 470 based on a corresponding entry of the delta-shifter block row 480. The techniques of FIG. 4 may therefore reduce instances of "independently" generating block row entries, simplifying operation of the decoder 148.

Figure 5:
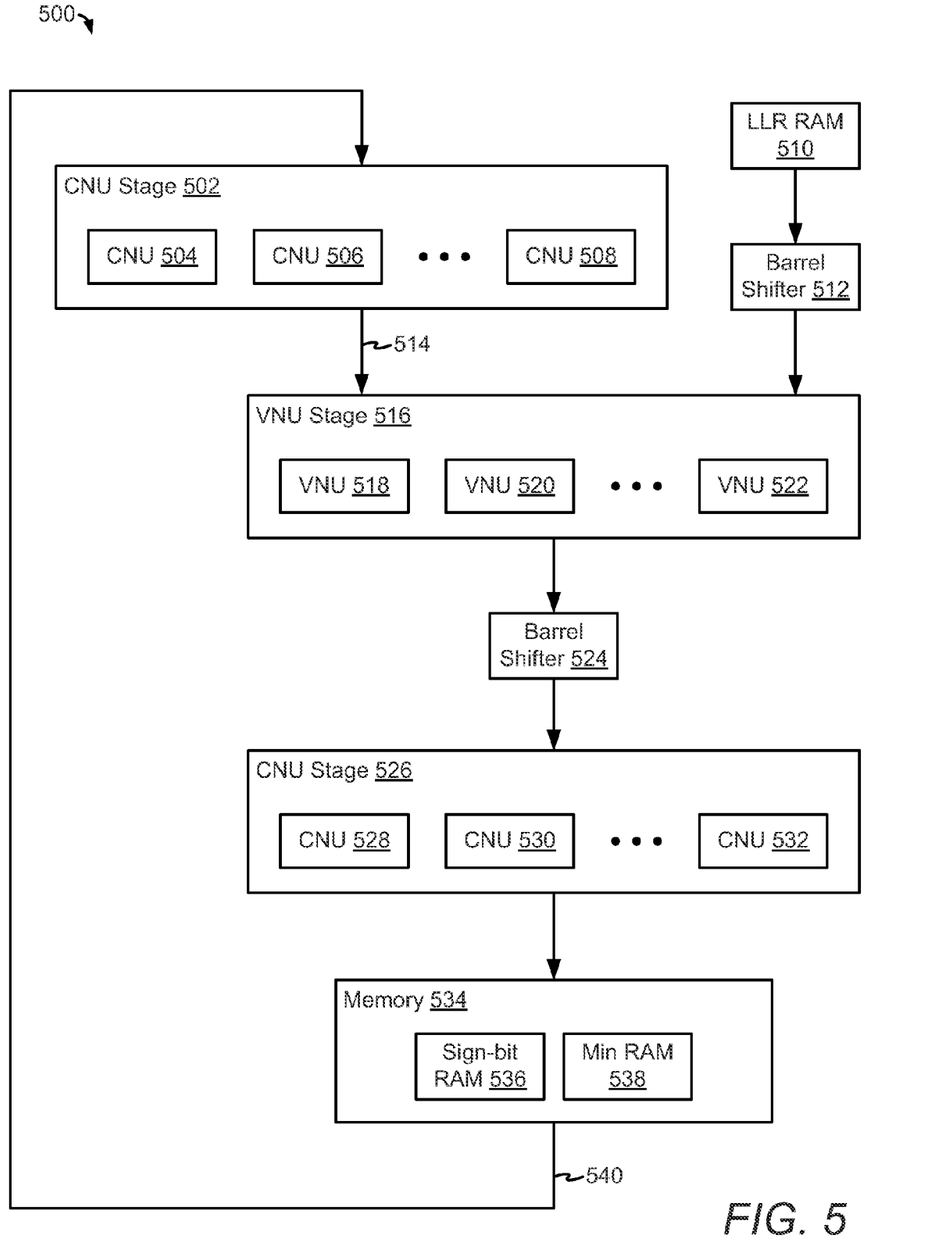
FIG. 5 is a diagram of an illustrative embodiment of a decoder that may be included in the data storage device of FIG. 1.

Referring to FIG. 5, a particular illustrative embodiment of a decoder is depicted and generally designated 500. The decoder 500 may be included within the data storage device 102. For example, the decoder 500 may be included within the decoder 148. An example algorithm corresponding to a particular operation of the decoder 500 is described in Table 1.

The decoder 500 includes a check node unit (CNU) stage 502, a log-likelihood ratio (LLR) random access memory (RAM) 510, a barrel shifter 512, and a variable node unit (VNU) stage 516. The CNU stage 502 may include one or more check node units, such as a CNU 504, a CNU 506, and a CNU 508. The barrel shifter may be responsive to the LLR RAM 510.

The VNU stage 516 may include one or more variable node units, such as a VNU 518, a VNU 520, and a VNU 522. The VNU stage 516 may be responsive to the CNU stage 502 and the barrel shifter 512. The CNU stage 502 and the VNU stage 516 may be directly coupled (e.g., without a barrel shifter stage coupled between the CNU stage 502 and the VNU stage 516). In the example of FIG. 5, the VNU stage 516 is directly coupled to the CNU stage 502 via a connection 514. The connection 514 may include a plurality of nodes (e.g., pipeline registers or wires) to directly provide results generated by the CNU stage 502 to the VNU stage 516. For example, the connection 514 may include a first node coupled between the CNU 504 and the VNU 518, a second node coupled between the CNU 506 and the VNU 520, and an nth node coupled between the CNU 508 and the VNU 522, where n is a positive integer number indicating a number of CNUs of the CNU stage 502 and/or a number of VNUs of the VNU stage 516.

The decoder 500 may further include a barrel shifter 524, a CNU stage 526, and a memory 534. The CNU stage 526 may include one or more check node units, such as a CNU 528, a CNU 530, and a CNU 532. The memory 534 may include a sign-bit RAM 536 and a "minimum" (min1/min2/min3/index(location of min1)) RAM 538. The memory 534 may be coupled to the CNU stage 502, such as via a feedback path 540.

In operation, LLRs may be input to the LLR RAM 510. To generate the LLRs, the controller 110 may sense the data 106 using a "soft" read technique, and the controller 110 may determine the LLRs by computing likelihoods of each bit of the data 106 having a "0" bit value or a "1" bit value. The LLRs may correspond to the data 116 and may be updated each iteration of the LDPC decoding operation. The decoder 500 may provide the LLRs to the barrel shifter 512 to generate shifted LLRs.

The VNU stage 516 may receive the shifted LLRs from the barrel shifter 512. The VNUs 518, 520, and 522 may be configured to perform variable node update operations using the shifted LLRs. For example, the VNUs 518, 520, and 522 may be configured to check the shifted LLRs to see if any of the shifted LLRs "agree" on a particular bit value. The VNU stage 516 may generate a first set of results based on the shifted LLRs. The first set of results may include a first set of updated LLRs.

The first set of results may be provided to the barrel shifter 524. The barrel shifter 524 may shift the first set of results to generate a shifted first set of results. The shifted set of first results may be provided to the CNU stage 526. The CNU stage 526 may perform check node update operations using the shifted first set of results. For example, the CNUs 528, 530, and 532 may perform parity check operations using the shifted first set of results. The CNUs 528, 530, and 532 may generate a second set of results based on the check node update operations. The second set of results may include a set of sign bits and message values for check node messages for each of the check nodes.

The second set of results can be stored at the memory 534, such as at the sign-bit RAM 536 and at the min RAM 538. The second set of results may be provided to the CNU stage 502, such as via the feedback path 540. The decoder 500 may initiate a subsequent iteration of the decoding operation using the second set of results, such as by performing check node update operations at the CNU stage 502 and continuing to iterate the decoding operation until either the decoder 500 "converges" on a particular set of data values or the decoding operation times out (e.g., after a certain number of iterations occur without convergence of the decoder 500 on a set of data values).

The example of FIG. 5 illustrates that the CNU stage 502 and the VNU stage 516 can be directly coupled, such as via the connection 514. The decoder 500 may operate in accordance with a parity check matrix having non-zero entries that are "pre-shifted" to enable the direct coupling of the CNU stage 502 and the VNU stage 516. For example, because entries of the parity check matrix 350 within a block row are shifted relative to previous row entries within the block row, the decoder 500 may avoid "independently" shifting each non-zero value of the parity check matrix 350 by a shifted amount and then shifting the non-zero value back to its original state in preparation for a next "absolute" shift. The parity check matrix 350 may have one or more block rows corresponding to the block row 470 that can be delta-shifted based on the delta-shifter block row 480. By avoiding use of a barrel shifter between the CNU stage 502 and the VNU stage 516, operation of the decoder 500 is simplified.

Figure 6:
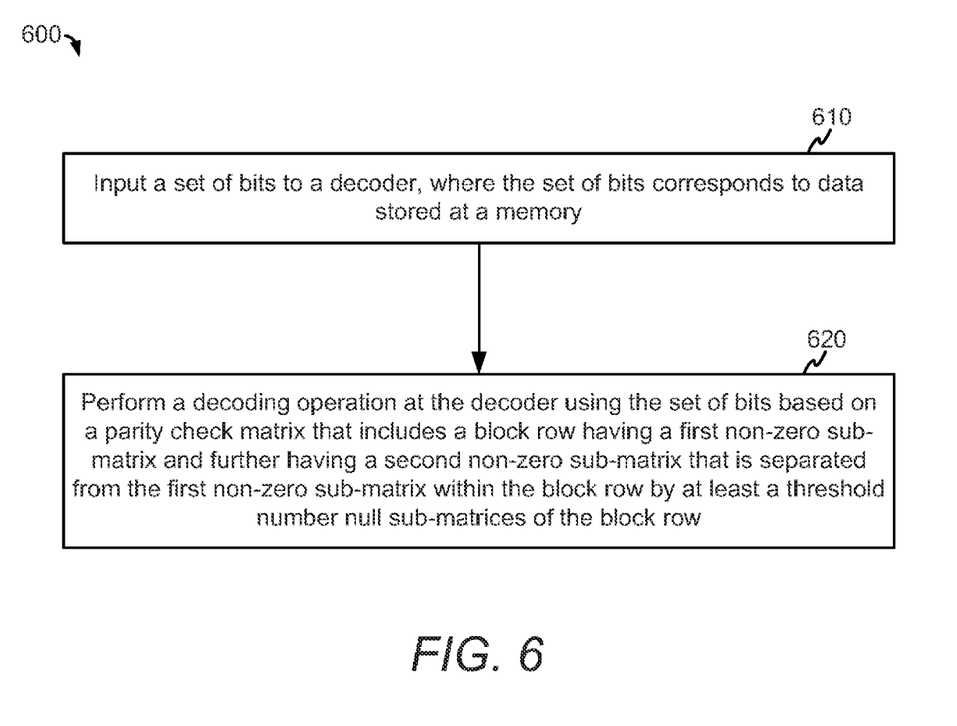
FIG. 6 is a flow diagram of a particular illustrative embodiment of a method of operating the data storage device of FIG. 1.

Referring to FIG. 6, a particular illustrative embodiment of a method is depicted and generally designated 600. The method 600 may be performed in the data storage device 102, such as by the controller 110. According to further examples, a memory may include "in-memory" error correction coding (ECC) hardware that can perform one or more operations of the method 600. For example, the nonvolatile memory 104 may have in-memory ECC hardware that is configured to perform one or more operations of the method 600.

The method 600 may include inputting a set of bits to a decoder, where the set of bits corresponds to data stored at a memory, at 610. The data may correspond to the data 106, and the set of bits may correspond to the data 116. The memory may correspond to the nonvolatile memory 104, and the decoder may correspond to one or both of the decoders 148, 500.

The method 600 may further include performing a decoding operation at the decoder using the set of bits based on a parity check matrix that includes a block row having a first non-zero sub-matrix and further having a second non-zero sub-matrix that is separated from the first non-zero sub-matrix within the block row by at least a threshold number of null sub-matrices of the block row, at 620. The parity check matrix may correspond to the data 118, and the block row may correspond to the block row 122. The first non-zero sub-matrix may correspond to the non-zero sub-matrix 124, and the second non-zero sub-matrix may correspond to the non-zero sub-matrix 132. The null sub-matrices may correspond to the null sub-matrices 128. In a particular embodiment, the threshold number of sub-matrices is three.

The method 600 enables a pipeline configuration of a decoder, which may facilitate parallel processing of variable node processing and multiple stages of check node processing. To illustrate, because the second non-zero sub-matrix is separated from the first non-zero sub-matrix within the block row by at least a threshold number of null sub-matrices of the block row, decoder hardware can be designed to "stagger" decoding operations that correspond to non-zero entries of the parity check matrix. Referring again to FIG. 5, the CNU stage 502, the VNU stage 516, and the CNU stage 526 correspond to a decoding pipeline. A first stage of the decoding pipeline, such as the CNU stage 526, may perform operations corresponding to the non-zero sub-matrix 132 after another stage of the pipeline performs one or more operations corresponding to the non-zero sub-matrix 124. The operations corresponding to the non-zero sub-matrix 132 may depend on a previous entry in the block row 122 (e.g., the non-zero sub-matrix 124). Because the decoding operations are staggered between stages of the pipeline, stalling of the pipeline to "wait" for the results associated with the operations corresponding to the non-zero sub-matrix 124 prior to performing the operations corresponding to the non-zero sub-matrix 132 can be avoided, improving performance at the decoder 500, while also achieving parallel processing at the CNU stage 502, the VNU stage 516, and the CNU stage 526.

Certain examples have been described herein with respect to column-layered decoding operations. For example, entries of a parity check matrix can be selected according to one or more "row constraints" that specify a threshold number of null sub-matrices separating pairs of non-zero sub-matrices within a block row. It should be appreciated that by using one or more "column constraints," a row-layered decoder can be achieved without departing from the scope of the present disclosure. For example, a row-layered decoder may perform LDPC decoding operations based on a parity check matrix having entries selected based on a column constraint that specifies a number of null sub-matrices within a block column that separate non-zero sub-matrices of the block column.

Although one or more components described herein are illustrated as block components and described in general terms, such components may include one or more microprocessors, state machines, or other circuits configured to enable the data storage device 102 (or one or more components thereof) to perform operations described herein. For example, one or more components described herein may correspond to one or more physical components, such as hardware controllers, state machines, logic circuits, one or more other structures, or a combination thereof, to enable the data storage device 102 to perform one or more operations described herein. One or more aspects of the data storage device 102 may be implemented using a microprocessor or microcontroller programmed to perform operations described herein, such as one or more operations of the method 600. Further, one or more operations described herein may be performed at the nonvolatile memory 104 (e.g., "in-memory" ECC decoding, as an illustrative example) alternatively or in addition to performing such operations at the controller 110. In a particular embodiment, the data storage device 102 includes a processor executing instructions that are stored at the nonvolatile memory 104. Alternatively or in addition, executable instructions that are executed by the processor may be stored at a separate memory location that is not part of the nonvolatile memory 104, such as at a read-only memory (ROM).

To further illustrate, the controller 110 may include a processor that is configured to execute instructions to perform certain operations (e.g., an algorithm) described herein. The instructions may include general purpose instructions, and the processor may include a general purpose execution unit operable to execute the instructions. The instructions may be stored at a non-transitory medium, which may correspond to a nonvolatile memory (e.g., the nonvolatile memory 104, or another memory). The processor may access the instructions from the nonvolatile memory 104, the memory 114, another memory location, or a combination thereof. The processor may execute the instructions to perform one or more operations described with reference to the decoder 148.

The processor may execute the instructions to input the data 116 to the decoder 148. To illustrate, the data storage device 102 may receive a request for read access to the data 106 from the host device 156. The request may specify a logical address associated with the data 106. In response to receiving the request, the controller 110 may translate the logical address to a physical address associated with the nonvolatile memory. To translate the logical address, the processor may execute one or more instructions to access a file table that indicates one or more logical-to-physical address mappings. The processor may execute one or more instructions to send a command to the nonvolatile memory 104. The command may specify the physical address. The nonvolatile memory 104 may access the data 106, such as using a soft read technique. The nonvolatile memory 104 may return the data 116 to the controller 110. The processor may execute one or more instructions to store (e.g., cache) the data 116 at the memory 114, such as by executing a "write" instruction.

The processor may execute one or more instructions to perform a decoding operation at the decoder 148 using the data 116 based on the parity check matrix indicated by the data 118. The one or more instructions may include instructions that cause the processor to perform variable node updates and check node updates. As a particular example, the processor may determine parity conditions specified by the parity check matrix by executing one or more instructions to perform exclusive-or (XOR) operations, multiplication operations, and operations to find a "minimum" value of a set of values. The processor may execute one or more instructions, such as add instructions, to perform the variable node updates based on the results of the check node updates.

Table 1 provides example pseudo-code for purposes of illustration. The example pseudo-code illustrates that certain operations described herein can be implemented using a processor that executes instructions. That is, a processor of the data storage device 102 may execute instructions corresponding to the pseudo-code of Table 1 to perform certain operations described herein.

TABLE 1 iter = 1,2, ... , $\max_{iter}$
{
  i = 1,2, ... , $N_{col}$
  {
    for j ∈ G(i),
    CNU1 : $\tilde{m}_{m,j}$ = {min 1, min 2, min 3, index}over{$m_{m,j}^{old}$/|$L_{j,m}$|}
    $\tilde{S}_{m,j} = S_{m,j} \oplus (L_j \geq 0)$
    $R_{m,j} = \tilde{S}_{m,j} * \min 1$     VNU: $L_{j,m} = L_j^{ch} + \alpha \sum_{k \in M(j) \backslash m} R_{k,j}, \; L_j = L_j^{ch} + \alpha \sum_{k \in M(j)} R_{k,j}$     CNU 2 : $m_{m,j}^{new}$ = {min 1, min 2, min 3, index}over{$\tilde{m}_{m,j}$,|$L_{j,m}$|}
    $S_{m,j} = \tilde{S}_{m,j} \oplus (L_{j,m} \geq 0)$
  }
  Hard decision based on $L_j$;convergency check.
}

$\tilde{m}_{m,j}$: temporary sorted minimum message of check m at column layer i
$m_{m,j}^{old}$: old sorted minimum message of check m at column layer i TABLE 1-continued $m_{m,i}^{new}$: new sorted minimum message of check m at column layer i
$\tilde{S}_{m,i}$: temporary sign of check m at column layer i
$S_{m,i}$: total sign of check m at column layer i
$R_{m,i}$: node message of check m to symbol at column layer i
$L_{i,m}$: LLR message of $m^{th}$ check to symbol at column layer i
$L_i$: total LLR message of symbol at column layer i
$L_i^{ch}$: channel LLR message of $i^{th}$ symbol
N(m): symbol set related to $m^{th}$ check
N(i): check set related to $i^{th}$ symbol
decoder begin with $L_{i,m} = L_i^{ch}$,
$m_{m,i} = \{\min 1, \min 2, \min 3\} \text{over}\{|L_{i,k}|, k \in N(m)/m\}$,
$S_{m,i} = \Sigma \oplus (L_{i,k} \geq 0), k \in N(m)/m$ The data storage device 102 may be attached to or embedded within one or more host devices, such as within a housing of a host communication device, which may correspond to the host device 156. For example, the data storage device 102 may be integrated within a packaged apparatus such as a mobile telephone, a music player, a video player, a gaming device or console, an electronic book reader, a personal digital assistant (PDA), a computer, such as a laptop, a tablet, or a notebook computer, a portable navigation device, or another device that uses internal nonvolatile memory. However, in other embodiments, the data storage device 102 may be implemented in a portable device configured to be selectively coupled to one or more external devices, such as the host device 156.

The host device 156 may correspond to a mobile telephone, a music player, a video player, a gaming device or console, an electronic book reader, a personal digital assistant (PDA), a computer, such as a laptop, a tablet, or a notebook computer, a portable navigation device, another electronic device, or a combination thereof. The host device 156 may communicate via a host controller, which may enable the host device 156 to communicate with the data storage device 102. The host device 156 may operate in compliance with a JEDEC Solid State Technology Association industry specification, such as an embedded MultiMedia Card (eMMC) specification or a Universal Flash Storage (UFS) Host Controller Interface specification. The host device 156 may operate in compliance with one or more other specifications, such as a Secure Digital (SD) Host Controller specification as an illustrative example. Alternatively, the host device 156 may communicate with the data storage device 102 in accordance with another communication protocol.

The data storage device 102 may be configured to be coupled to the host device 156 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The nonvolatile memory 104 may include a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), a resistive random access memory (ReRAM), or a combination thereof. Alternatively or in addition, the nonvolatile memory 104 may include another type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A device comprising:
   a nonvolatile memory, wherein the nonvolatile memory is configured to store a set of bits; and
   a controller coupled to the nonvolatile memory, the controller comprising a decoder to perform a decoding operation based on the set of bits and based on a parity check matrix that includes a block row having a first non-zero sub-matrix and a second non-zero sub-matrix that is separated from the first non-zero sub-matrix by at least a threshold number of null sub-matrices, the decoder comprising:
   a first check node unit (CNU) stage;
   a variable node unit (VNU) stage coupled to an output of the first CNU stage;
   a first shifter coupled to an output of the VNU stage;
   a second shifter coupled to a first memory and to an input of the VNU stage, the first memory configured to store log-likelihood ratio (LLR) information; and
   a second CNU stage coupled to an output of the first shifter and coupled to a second memory configured to store check node message information.

2. The device of claim 1, the threshold number is equal to three.

3. The device of claim 1, the decoding operation includes a check node update at the first CNU stage based on the first non-zero sub-matrix to generate updated check node information.

4. The device of claim 3, the first CNU stage coupled to the VNU stage to input the updated check node information to the VNU stage without use of a barrel shifter.

5. The device of claim 1, wherein the decoder comprises a decoding pipeline that comprises the first CNU stage, the VNU stage, and the second CNU stage, and wherein performing the decoding operation further comprises performing, during a pipeline clock cycle, a variable node unit (VNU) update operation at the VNU stage, first check node unit (CNU) update operation at the first CNU stage, and a second CNU update operation at the second CNU stage.

6. The device of claim 1, wherein the decoding operation is a column-layered low-density parity check (LDPC) decoding operation.

7. The device of claim 1, wherein the block row is a row of sub-matrices, and wherein the first non-zero sub-matrix and the second non-zero sub-matrix are non-zero circulant matrices.

8. The device of claim 1, wherein the decoder has a pipeline configuration comprising a number of pipeline stages that matches the threshold number of null sub-matrices of the parity check matrix.

9. The device of claim 1, wherein the second memory is configured to receive the check node message information from the second CNU stage and to provide the check node message information to the first CNU stage.

10. The device of claim 1, wherein the nonvolatile memory comprises a flash memory.

11. The device of claim 1, wherein the nonvolatile memory comprises a three-dimensional (3D) memory.

12. A method comprising:
in a data storage device that includes a nonvolatile memory and a controller having a decoder, wherein the nonvolatile memory is operatively coupled to the controller, performing:
    inputting a set of bits to the decoder, wherein the set of bits corresponds to data stored at the nonvolatile memory; and
    performing a decoding operation at the decoder using the set of bits based on a parity check matrix that includes a block row having a first circulant sub-matrix and further having a second circulant sub-matrix that is separated from the first circulant sub-matrix within the block row by at least a threshold number of null sub-matrices of the block row, the decoding operation comprises routing first data from an output of a first check node unit (CNU) stage to a variable node unit (VNU) stage coupled to the output of the first CNU stage, routing second data from an output of the VNU stage to a first shifter coupled to the output of the VNU stage, and routing third data from an output of the first shifter to a second CNU stage that is coupled to the output of the first shifter and coupled to a second memory configured to store check node message information, wherein a second shifter is coupled to a first memory and to an input of the VNU stage, the first memory configured to store log-likelihood ratio (LLR) information.

13. The method of claim 12, wherein performing the decoding operation includes performing a check node update at a check node unit based on the first circulant sub-matrix to generate updated check node information.

14. The method of claim 12, further comprising inputting the output of the first CNU stage to the VNU stage without shifting the output of the first CNU stage.

15. The method of claim 12, wherein the decoder has a pipeline configuration that is selected based on the parity check matrix.

16. The method of claim 12, wherein the decoding operation is a column-layered low-density parity check (LDPC) decoding operation.

17. The method of claim 12, wherein performing the decoding operation further comprises performing, during a pipeline clock cycle, a VNU update operation at the VNU stage, a first CNU update operation at the first CNU stage, and a second CNU update operation at the second CNU stage.

18. The method of claim 12, wherein the decoder has a pipeline configuration comprising a number of pipeline stages that matches the threshold number of null sub-matrices.

19. The method of claim 12, wherein the nonvolatile memory comprises a flash memory.

20. The method of claim 12, wherein the nonvolatile memory comprises a three-dimensional (3D) memory.

* * * * *